(12) United States Patent
Yao et al.

(10) Patent No.: US 9,834,965 B1
(45) Date of Patent: Dec. 5, 2017

(54) MULTI-LINK HINGE ASSEMBLY

(71) Applicant: FIRST DOME CORPORATION, New Taipei (TW)

(72) Inventors: Hsu-Hong Yao, New Taipei (TW); Kuei-Shen Chen, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

(21) Appl. No.: 15/480,843

(22) Filed: Apr. 6, 2017

(30) Foreign Application Priority Data

Nov. 29, 2016 (TW) .............................. 105218201 U

(51) Int. Cl.
| | | |
|---|---|---|
| *E05D 15/00* | (2006.01) | |
| *E05D 3/02* | (2006.01) | |
| *E05D 11/06* | (2006.01) | |
| *E05D 11/08* | (2006.01) | |
| *E05D 5/04* | (2006.01) | |
| *H05K 5/02* | (2006.01) | |

(52) U.S. Cl.
CPC ................ *E05D 3/02* (2013.01); *E05D 5/04* (2013.01); *E05D 11/06* (2013.01); *E05D 11/087* (2013.01);
(Continued)

(58) Field of Classification Search
CPC .... E05D 3/02; E05D 3/12; E05D 3/06; E05D 3/122; E05D 3/10; E05D 5/04; E05D 11/06; E05D 11/087; E05D 3/14; E05D 3/142; E05D 3/16; E05D 3/125; E05D 3/127; E05D 3/185; E05D 7/04; E05D 7/0423; E05D 7/0415; E05D 7/043; E05D 7/0027; E05D 7/0045; E05D 5/02; E05D 5/062; E05D 2007/0438; E05D 2007/0446; E05D 2007/0453; E05D 2007/0461; E05D 2007/0469; E05D 2007/0476; E05D 2007/0484; E05D 2007/0492; G06F 1/1681; G06F 1/1616; G06F 1/1618; G06F 1/168; E05Y 2900/606; E05Y 2900/602;
(Continued)

(56) References Cited

U.S. PATENT DOCUMENTS 3,001,224 A * 9/1961 Soss .......................... E05D 3/16
16/276
8,074,323 B2 * 12/2011 Lin .......................... G06F 1/162
16/345
(Continued)

FOREIGN PATENT DOCUMENTS

DE 10164979 B4 * 8/2007 ............. E05D 3/186
EP 1754848 A2 * 2/2007 ............. E05D 3/186
(Continued)

*Primary Examiner* — Chuck Mah
(74) *Attorney, Agent, or Firm* — Michael Best & Friedrich LLP

(57) ABSTRACT

A multi-link hinge assembly includes first and second link levers, first and second sliding rods, first and second bases, a central shaft, and first and second torque shafts. The first link lever is connected to the second base by the second torque shaft and is slidable along with the first sliding rod within the first base. The second link lever is connected to the first base by the first torque shaft and is slidable along with the second sliding rod within the second base. The central shaft extends through the first and second link levers. When the second base is rotated relative to the first torque shaft, the first and second sliding rods move toward the central shaft.

5 Claims, 9 Drawing Sheets

(52) U.S. Cl.
CPC ......... *H05K 5/0226* (2013.01); *H05K 5/0234* (2013.01); *E05Y 2900/606* (2013.01)

(58) Field of Classification Search
CPC ........... E05Y 2600/41; E05Y 2600/634; E05Y 2600/412; E05Y 2600/45; E05Y 2600/452; E05Y 2600/46; E05Y 2900/132; E05Y 2900/20; E05Y 2900/50; E05Y 2900/531; E05Y 2900/546; E05Y 2201/638; Y10T 16/547; Y10T 16/5837; Y10T 16/53864; Y10T 16/542; Y10T 16/540255; Y10T 16/533; Y10T 16/5938; Y10T 16/54038; H04M 1/0216; H04M 1/0222; H04M 1/022; H05K 5/0226; H05K 5/0234
See application file for complete search history.

(56) References Cited

U.S. PATENT DOCUMENTS

| | | | | |
|---|---|---|---|---|
| 8,434,197 B2 * | 5/2013 | Oshima | .................. | E05D 3/186 16/241 |
| 8,644,013 B2 * | 2/2014 | Chung | .................. | G06F 1/1681 16/392 |
| 8,650,713 B2 * | 2/2014 | Migliorini | ................. | E05D 3/16 16/298 |
| 8,656,623 B1 * | 2/2014 | Chvala | .................... | F41C 23/04 42/73 |
| 8,683,651 B2 * | 4/2014 | Liermann | ................. | E05D 7/04 16/235 |
| 9,404,598 B2 * | 8/2016 | Girouard | ................. | F16K 17/38 |
| 2003/0088943 A1 * | 5/2003 | Neukotter | ............... | E05D 3/186 16/366 |
| 2005/0198778 A1 * | 9/2005 | Neukotter | ................. | E05D 3/06 16/366 |
| 2008/0289146 A1 * | 11/2008 | Chen | ....................... | E05D 3/186 16/372 |
| 2010/0115729 A1 * | 5/2010 | Neukoetter | ............. | E05D 3/186 16/235 |
| 2012/0180396 A1 * | 7/2012 | Liermann | ............... | E05D 3/186 49/398 |

FOREIGN PATENT DOCUMENTS

| | | | | |
|---|---|---|---|---|
| EP | 2832943 A1 * | 2/2015 | ............. | E05D 3/186 |
| JP | 06288139 A * | 10/1994 | ............. | E05D 3/186 |
| JP | 2008008015 A * | 1/2008 | | |

\* cited by examiner

MULTI-LINK HINGE ASSEMBLY

CROSS-REFERENCE TO RELATED APPLICATION

This application claims priority to Taiwanese Patent Application No. 105218201, filed on Nov. 29, 2016.

FIELD

The disclosure relates to a hinge assembly, and more particularly to a multi-link hinge assembly.

BACKGROUND

An existing foldable back support holder is operable to support and hold a mobile electronic device at a desired inclined position. The existing foldable back support holder includes a main body, a kickstand and a conventional hinge assembly connecting the kickstand to the main body. With the conventional hinge assembly, the kickstand is pivotal relative to the main body to adjust an angle between the main body and the kickstand. For aesthetic reason, a gap formed between the kickstand and the main body is expected to be minimized when the existing foldable back support holder is in a fully folded state. However, the conventional hinge assembly may not satisfy such expectation.

SUMMARY

Therefore, an object of the disclosure is to provide a multi-link hinge assembly which can be assembled with a foldable back support holder and with which a gap between a main body and a kickstand of the back support holder can be minimized to reduce an entire thickness of the foldable back support holder.

According to the disclosure, a multi-link hinge assembly includes a first link lever unit, a second link lever unit, a central shaft, a first base, a second base, a first torque shaft, and a second torque shaft.

The first link lever unit includes a first link lever and a first sliding rod. The first link lever has a first fixed end and a first sliding end opposite to the first fixed end. The first sliding rod extends through the first sliding end.

The second link lever unit includes a second link lever and a second sliding rod. The second link lever has a second fixed end and a second sliding end opposite to the second fixed end. The second fixed end overlaps the first fixed end. The second sliding rod is parallel to the first sliding rod and extends through the second sliding end.

The central shaft extends through the first and second link levers between the first fixed end and the first sliding end and between the second fixed end and the second sliding end.

The first base has a first inner end proximate to the central shaft, a first outer end distal from the central shaft, and two opposite first sliding grooves each extending from the first inner end to the first outer end. The first sliding end is slidably disposed in the first base. The second fixed end extends into the first inner end of the first base. The first sliding rod has two opposite ends respectively and slidably disposed in the first sliding grooves.

The second base is juxtaposed with the first base, and has a second inner end proximate to the central shaft, a second outer end distal from the central shaft, and two opposite second sliding grooves each extending from the second inner end to the second outer end. The second sliding end is slidably disposed in the second base. The first fixed end extends into the second inner end of the second base. The second sliding rod has two opposite ends respectively and slidably disposed in the second sliding grooves.

The first torque shaft is parallel to the central shaft and extends through the first base and the second fixed end. The first torque shaft is connected to the first base in interference fit.

The second torque shaft is parallel to the central shaft and extends through the second base and the first fixed end. The second torque shaft is connected to the second base in interference fit.

When the second base is rotated relative to the first torque shaft, the first sliding rod moves along the first sliding grooves toward the central shaft, and the second sliding rod moves along the second sliding grooves toward the central shaft.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
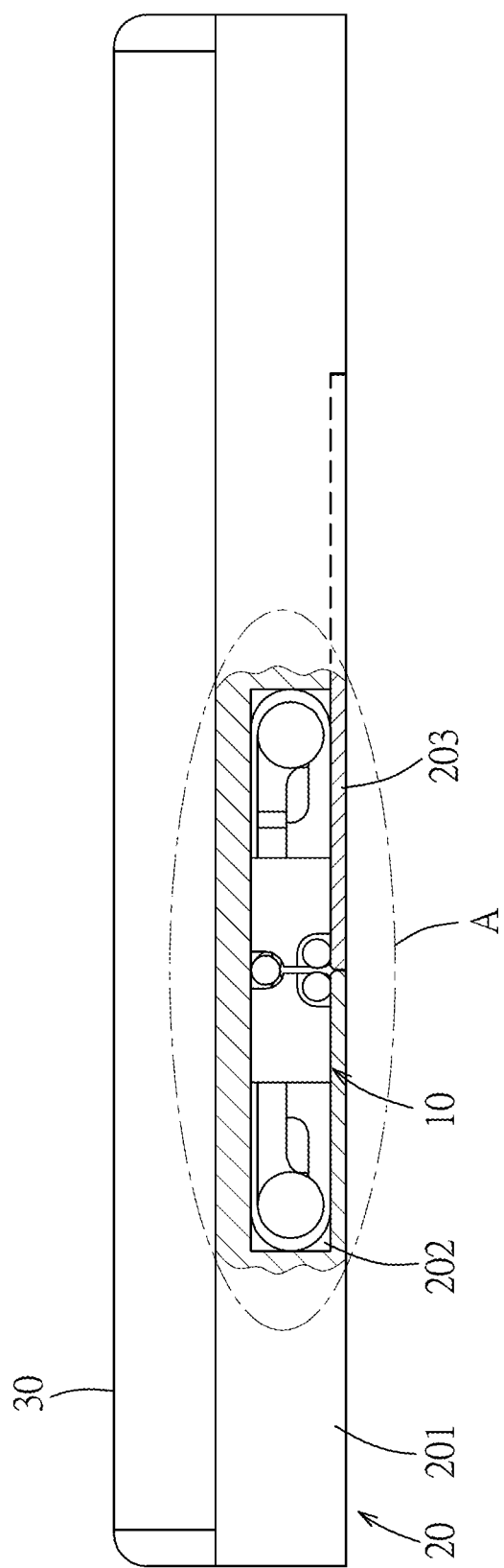
FIG. 1 is a partly sectioned side view of a foldable back support holder incorporating a multi-link hinge assembly according to an embodiment of the present disclosure.
Figure 2:
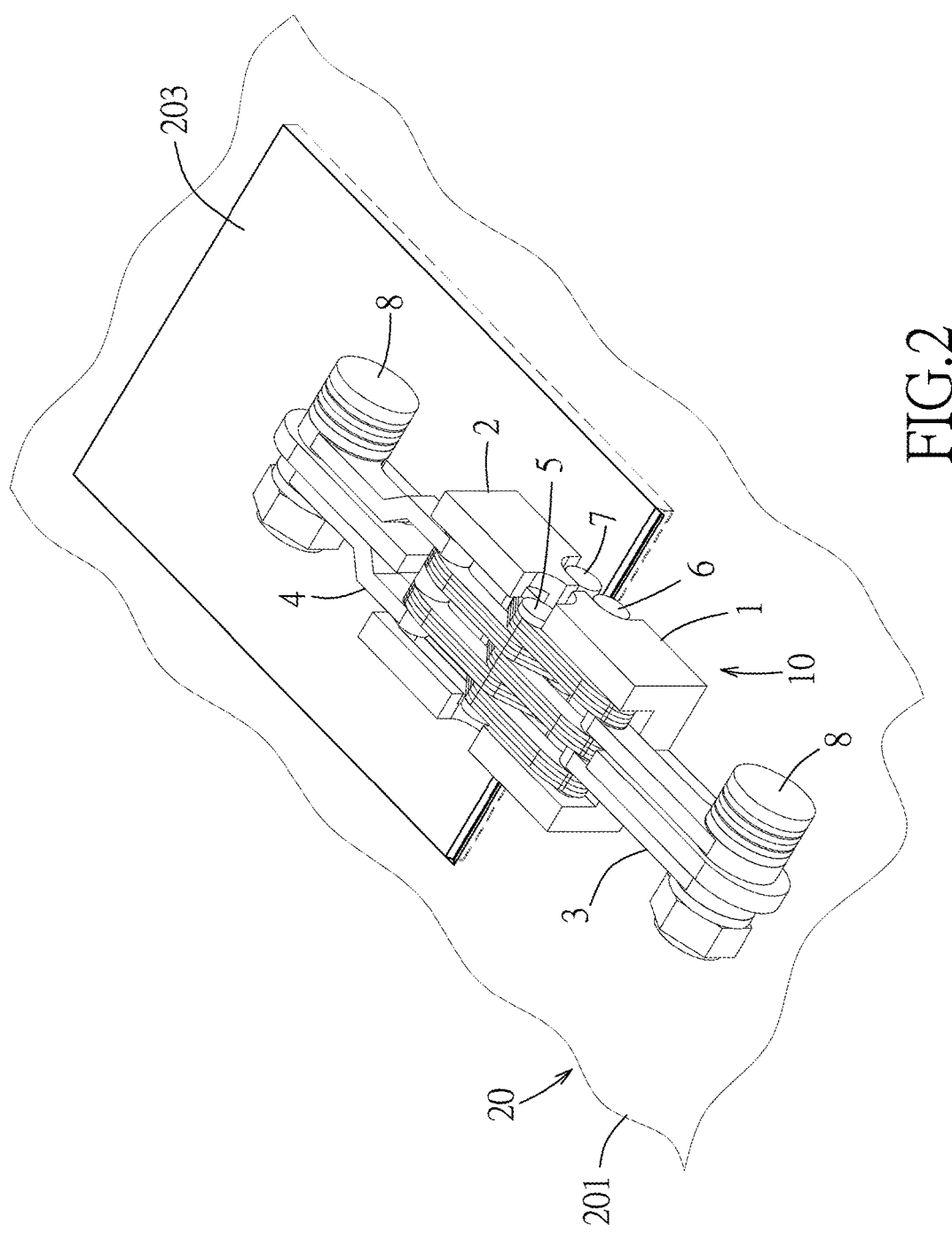
FIG. 2 is a perspective view of the multi-link hinge assembly according to the embodiment.

Referring to FIGS. 1 and 2, a multi-link hinge assembly 10 according to an embodiment of the present disclosure is used in a foldable back support holder 20 holding a mobile electronic device 30. The foldable back support holder 20 includes a main body 201 and a support plate 203. The main body 201 has a mount groove 202 in which the multi-link hinge assembly 10 is mounted. The support plate 203 is pivotally connected to the main body 201 by the multi-link hinge assembly 10. In use, the support plate 203 is unfolded from the main body 201 to support the mobile electronic device 30 at a desired inclined position. The multi-link hinge assembly 10 includes a first base 1, a second base 2, a first link lever unit 3, a second link lever unit 4, a central shaft 5, a first torque shaft 6, a second torque shaft 7 and two torque units 8.

Figure 3:
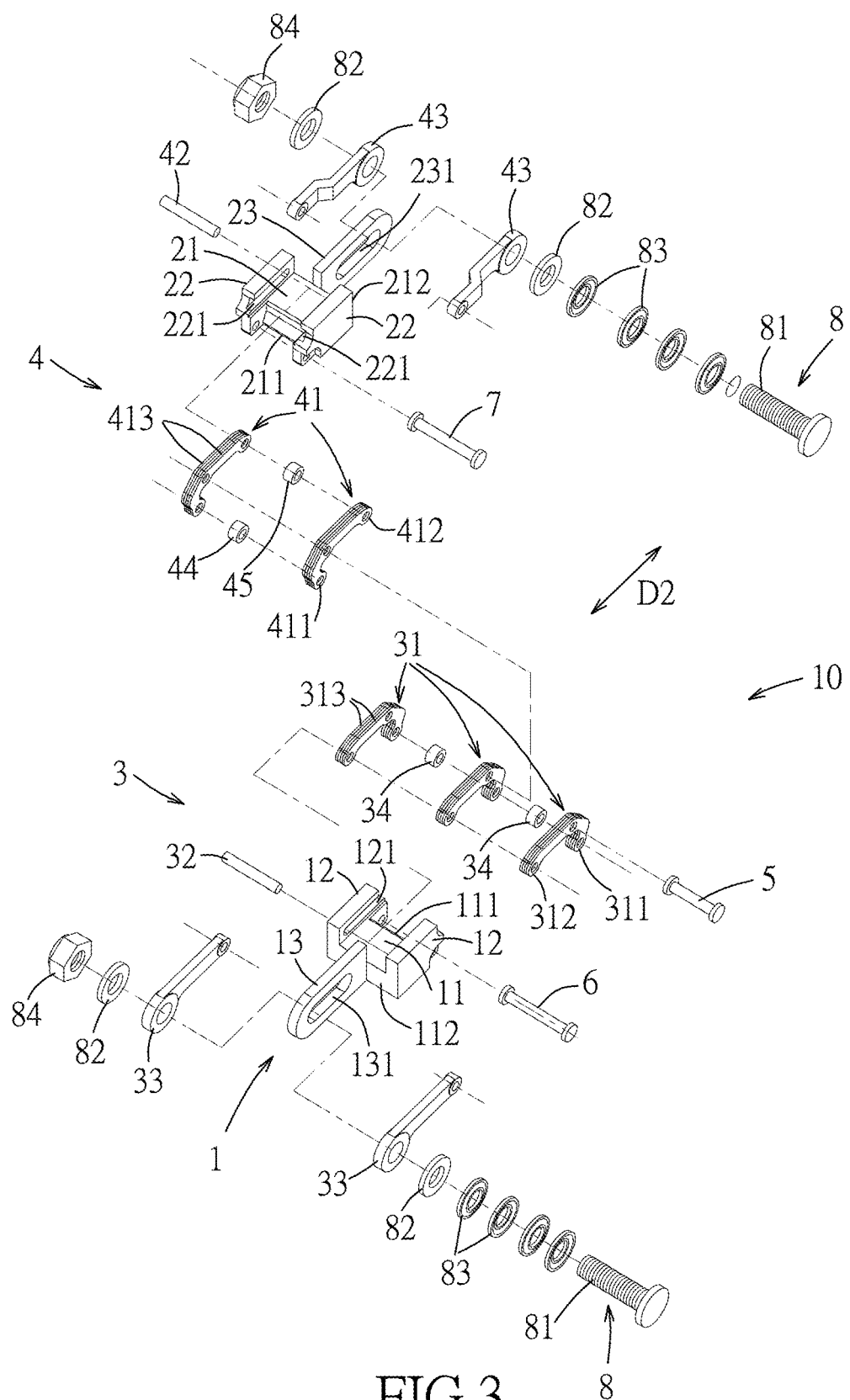
FIG. 3 is an exploded view of the multi-link hinge assembly of the embodiment.
Figure 4:
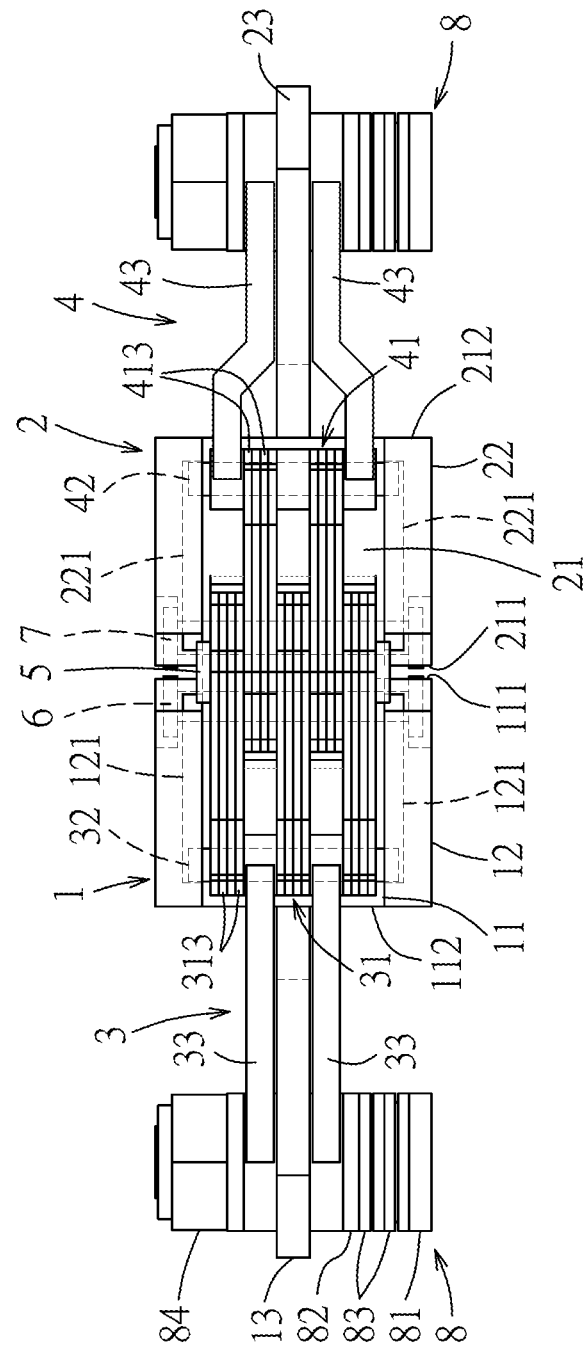
FIG. 4 is a top view of the multi-link hinge assembly of the embodiment.

Referring to FIGS. 3 and 4, in combination with FIG. 2, the first base 1 is mounted on the main body 201, and has a first inner end 111, a first outer end 112, a first bottom wall 11, two opposite first side walls 12 and a first extension plate 13. The first inner and outer ends 111, 112 are opposite to each other. The two opposite first side walls 12 are connected to and extend upwardly from two opposite sides of the first bottom wall 11, respectively. Each of the first bottom wall 11 and the first side walls 12 extends from the first inner end 111 to the first outer end 112. Each first side wall 12 has a first sliding groove 121 extending from the first inner end 111 to the first outer end 112. The first sliding grooves 121 of the first slide walls 12 face each other. A length of each first side wall 12 from the first inner end 111 to the first outer end 112 is greater than that of the first bottom wall 11. Each first side wall 12 has an end flush with the first outer end 112. The first extension plate 13 is connected to the first bottom wall 11 at the first outer end 112, and has an arcuate end distal from the first outer end 112 and a first elongated opening 131 elongated from the first outer end 112 to the arcuate end.

The second base 2 is mounted on the support plate 203, and has a second inner end 211, a second outer end 212, a second bottom wall 21, two opposite second side walls 22 and a second extension plate 23. The second inner and outer ends 211, 212 are opposite to each other. The two opposite second side walls 22 are connected to and extend upwardly from two opposite sides of the second bottom wall 21, respectively. Each of the second bottom wall 21 and the second side walls 22 extends from the second inner end 211 to the second outer end 212. Each second side wall 22 has a second sliding groove 221 extending from the second inner end 211 to the second outer end 212. The second sliding grooves 221 of the second side walls 22 face each other. A length of each second side wall 22 from the second inner end 211 to the second outer end 212 is greater than that of the second bottom wall 21. Each second side wall 22 has an end flush with the second outer end 212. The second extension plate 23 is connected to the second bottom wall 21 at the first outer end 212. The second extension plate 23 has an arcuate end distal from the second outer end 212 and a second elongated opening 231 elongated from the second outer end 212 to the arcuate end. The first inner end 111 of the first base 1 is disposed adjacent to the second inner end 211 of the second base 2 without contacting each other.

The first link lever unit 3 includes three first link levers 31, a first sliding rod 32, two third link levers 33, and two first packing rings 34. Each first link lever 31 has a first fixed end 311, and a first sliding end 312 opposite to the first fixed end 311. The second torque shaft 7 is inserted in interference fit into each of the second side walls 22 of the second base 2, the first fixed ends 311 of the first link levers 31, and the first packing rings 34. Therefore, the first link levers 31 are pivotally connected to the second base 2, and the second torque shaft 7 is connected to the second side walls 22 in interference fit. The first sliding rod 32 extends through the first sliding ends 312 of the first link levers 31. Two ends of the first sliding rod 32 are slidably and respectively received in the first sliding grooves 121. The third link levers 33 are respectively and slidably disposed on two opposite sides of the first extension plate 13. Each third link lever 33 has an end disposed between two adjacent ones of the first sliding ends 312 of the first link levers 31. The first sliding rod 32 extends through the ends of the third link levers 33.

The second link lever unit 4 includes two second link levers 41, a second sliding rod 42, two fourth link levers 43, a second packing ring 44 and a third packing ring 45. Each second link lever 41 has a second fixed end 411 and a second sliding end 412 opposite to the second fixed end 411. The second fixed ends 411 of the second link levers 41 are overlapped with the first fixed ends 311 of the first link levers 31. The second sliding end 412 extends oppositely to the first sliding end 312 of each first link lever 31. The first torque shaft 6 is in interference fit into each of the first side walls 12 of the first base 1, the second fixed ends 411 of the second link levers 41, and the second packing ring 44. Therefore, the second link levers 41 are pivotally connected to the first base 1, and the first torque shaft 6 is connected to the first side walls 12 in interference fit. The second sliding rod 42 extends through the second sliding ends 412 of the second link levers 41 and is parallel to the first sliding rod 32. Two opposite ends of the second sliding rod 42 are respectively and slidably disposed in the second sliding grooves 221. The fourth link levers 43 are respectively and slidably disposed on two opposite sides of the second extension plate 23. An end of each fourth link lever 43 overlaps one of the second link levers 41. The second sliding rod 42 extends through the ends of the fourth link levers 43. The third packing ring 45 is disposed between the second sliding ends 412 of the second link levers 41 and is sleeved on the second sliding rod 42.

Figure 5:
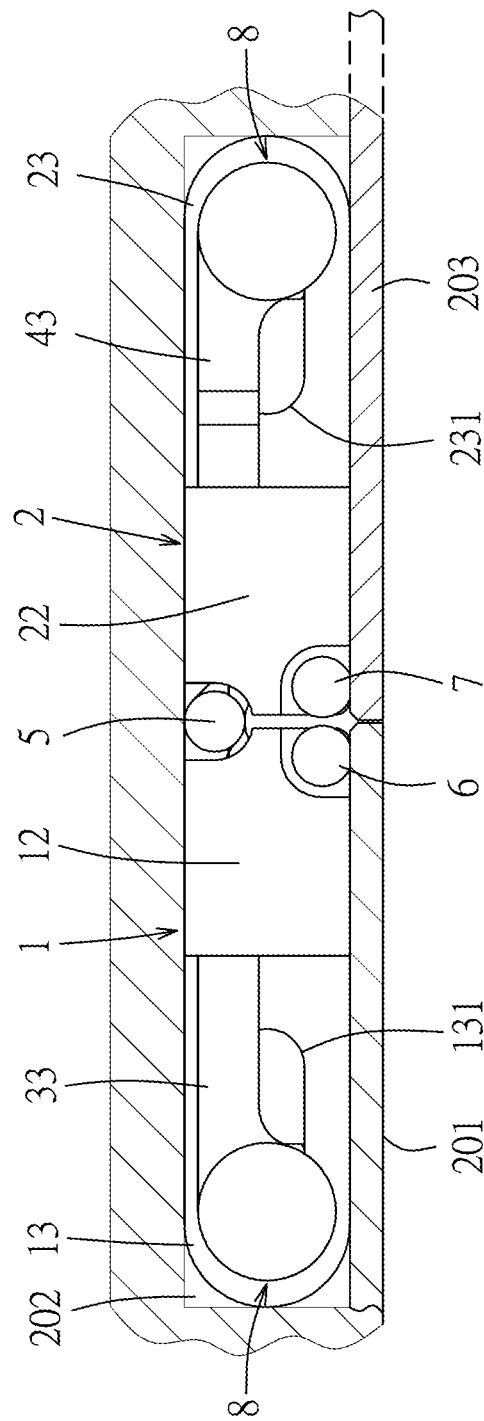
FIG. 5 is an enlarged view of an encircled portion A in FIG. 1.

The central shaft 5 extends through the first and second link levers 31, 41 between the first fixed end 311 and the first sliding end 312 and between the second fixed end 411 and the second sliding end 412. As shown in FIG. 5, the highest end of the central shaft 5 is flush with the top ends of the first and second bases 1, 2. In addition, because the first sliding rod 32 together with the first sliding ends 312 of the first link levers 31 is operated to move only along the first sliding grooves 121 of the first side walls 12, and because the second sliding rod 42 together with the second sliding ends 412 of the second link levers 41 is operated to move only along the second sliding grooves 221 of the second side walls 22, the first and second link levers 31, 41 do not move in an upward direction relative to the first and second bases 1, 2, thereby allowing the first and second bases 1,2 to have a reduced height. Therefore, the foldable back support holder 20 may be miniaturized by incorporating the multi-link hinge assembly 10.

It is worth to mention that each first link lever 31 can be identical in shape and size to each second link lever 41, so that each of the first and second link levers 31, 41 can be manufactured by using a common mold to save the time and cost of preparing molds. While, in this embodiment, each first link lever 31 has a plurality of first lever plates 313 juxtaposed with each other and each second link lever 41 has a plurality of second lever plates 413 juxtaposed with each other, each of the first and second link levers 31, 41 may be configured as a one-piece component.

The torque units 8 are respectively connected to the pair of the third link levers 33 and the pair of the fourth link levers 43. Each torque unit 8 includes a spindle 81, two friction plates 82, a plurality of resilient plates 83 and a fastener 84. The spindle 81 of one of the torque units 8 is inserted into one end of each third link lever 33, and is slidable along and extends through the first elongated openings 131. The spindle 81 of another one of the torque units 8 is inserted into one end of each fourth link lever 43, and is slidable along and extends through the second elongated openings 231. Because the two torque units 8 are identical, only one torque unit 8 connected to the third link levers 33 will be detailed herein for simplification. Each friction plate 82 of one of the torque units 8 is sleeved on the spindle 81 and abuts against one side of one of the third link levers 33 opposite to the first extension plate 13. Each friction plate 82 of another one of the torque units 8 is sleeved on the spindle 81 and abuts against one side of one of the fourth link levers 43 opposite to the second extension plate 23. The resilient plates 83 of one of the torque units 8 are sleeved on the spindle 81 in juxtaposition to one of the friction plates 82 to resiliently push the friction plate 82 against one of the third link levers 33. The resilient plates 83 of another one of the torque units 8 are sleeved on the spindle 81 in juxtaposition to one of the friction plates 82 to resiliently push the friction plate 82 against one of the fourth link levers 43. The fastener 84 of one of the torque units 8 is a nut threadedly attached to the spindle 81 to tightly hold the friction plates 82 and the resilient plates 83 against the third link levers 33 and to compress the resilient plates 83 that provide a resilient force. The fastener 84 of another one of the torque units 8 is a nut threadedly attached to the spindle 81 to tightly hold the friction plates 82 and the resilient plates 83 against the fourth link levers 43 and to compress the resilient plates 83 that provide a resilient force.

Figure 6:
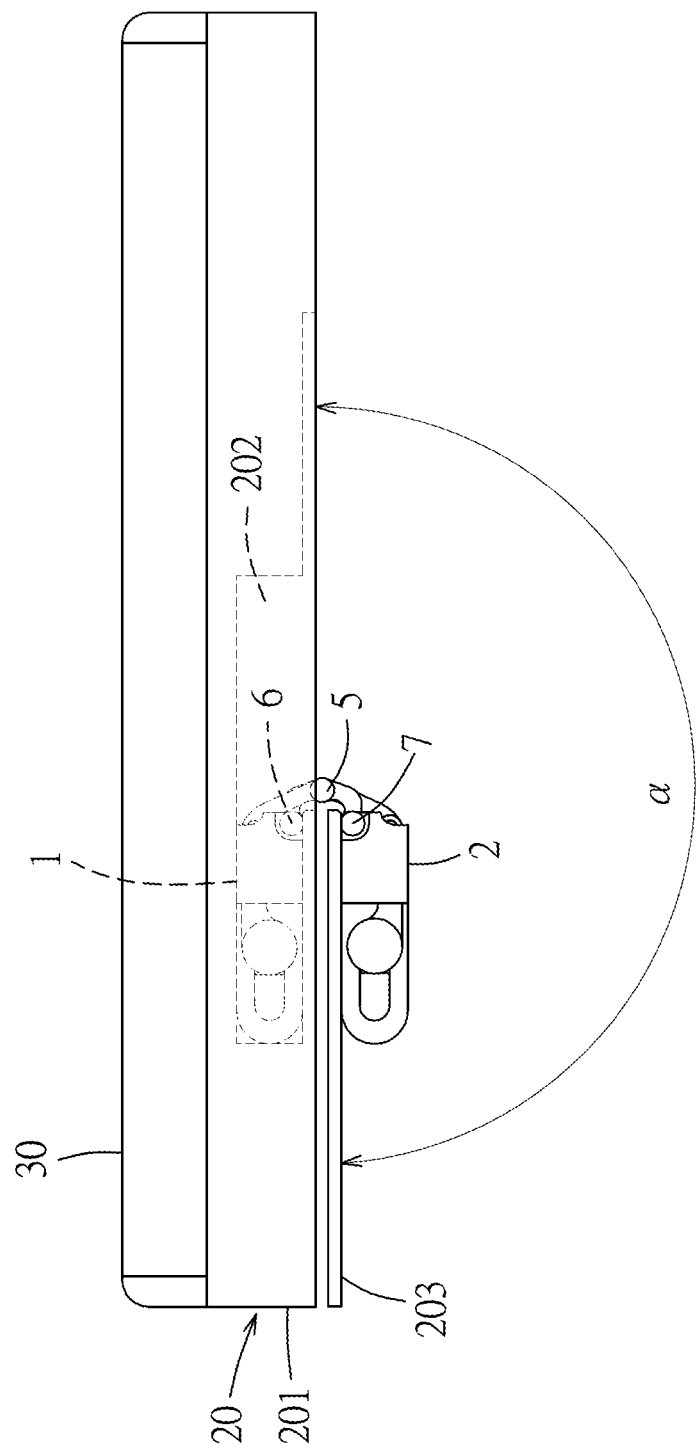
FIG. 6 is a side view of the embodiment, illustrating a support plate of the foldable back support holder that is rotated to a first angle relative to a main body.
Figure 7:
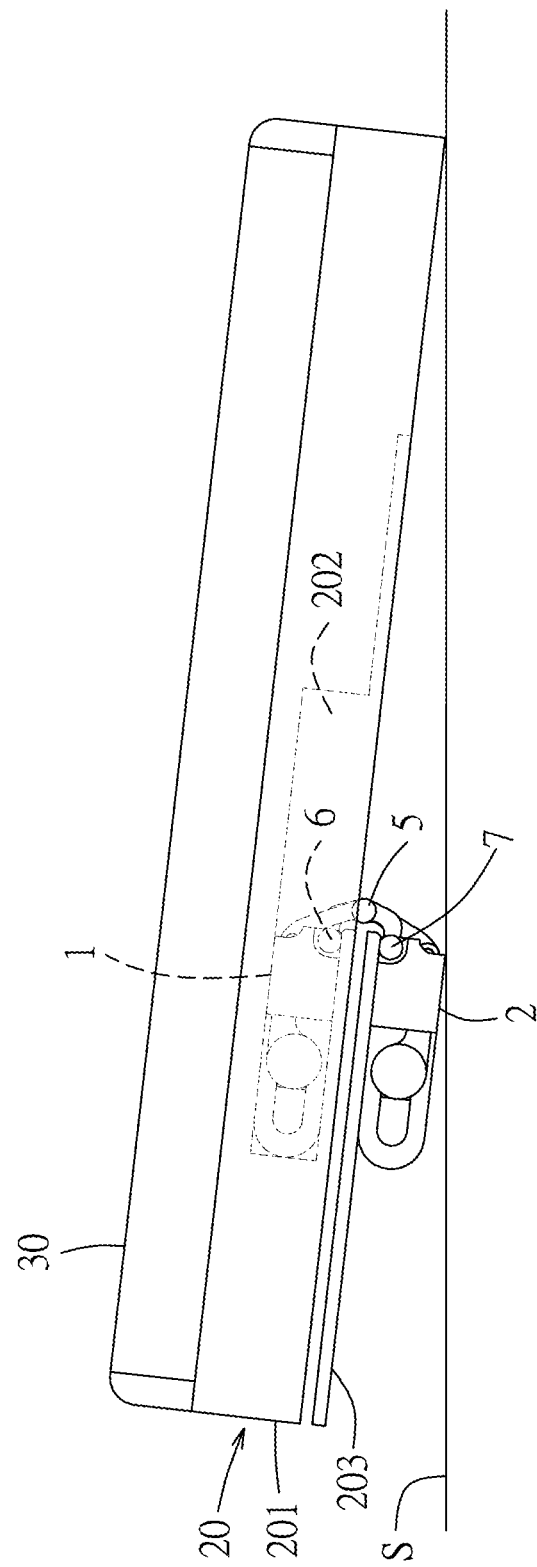
FIG. 7 is a side view illustrating that the support plate of the foldable back support holder rotated to the first angle is placed on a support surface to hold an electronic device at an inclined position.

Referring to FIGS. 5 to 7, when the foldable back support holder 20 is placed on a surface (S) and when the support plate 203 is unfolded outward from the main body 201, the outward movement of the support plate 203 causes the second base 2 to rotate relative to the first base 1 and the first torque shaft 6. As the second base 2 rotates, the first and second sliding rods 32, 42 move along the respective first and second sliding grooves 121, 221 toward the central shaft 5, bringing the torque units 8 toward the central shaft 5. Because the second torque shaft 7 is interference fit with and said second base 2 and because the first torque shaft 6 is interference fit with the first base 1, a first torsional friction force is created to resist rotation of the second base 2 relative to the first base 1 and the first torque shaft 6. In addition, the fastener 84 and the compressed resilient plates 83 of the torque units 8 provide a second torsional friction force to resist relative rotation of the first and second base 1, 2. Accordingly, the second base 2 can be retained at a first predetermined angle (α) relative to the first torque shaft 6, and the foldable back support holder 20 is lifted from the surface (S) by the base 2.

Figure 8:
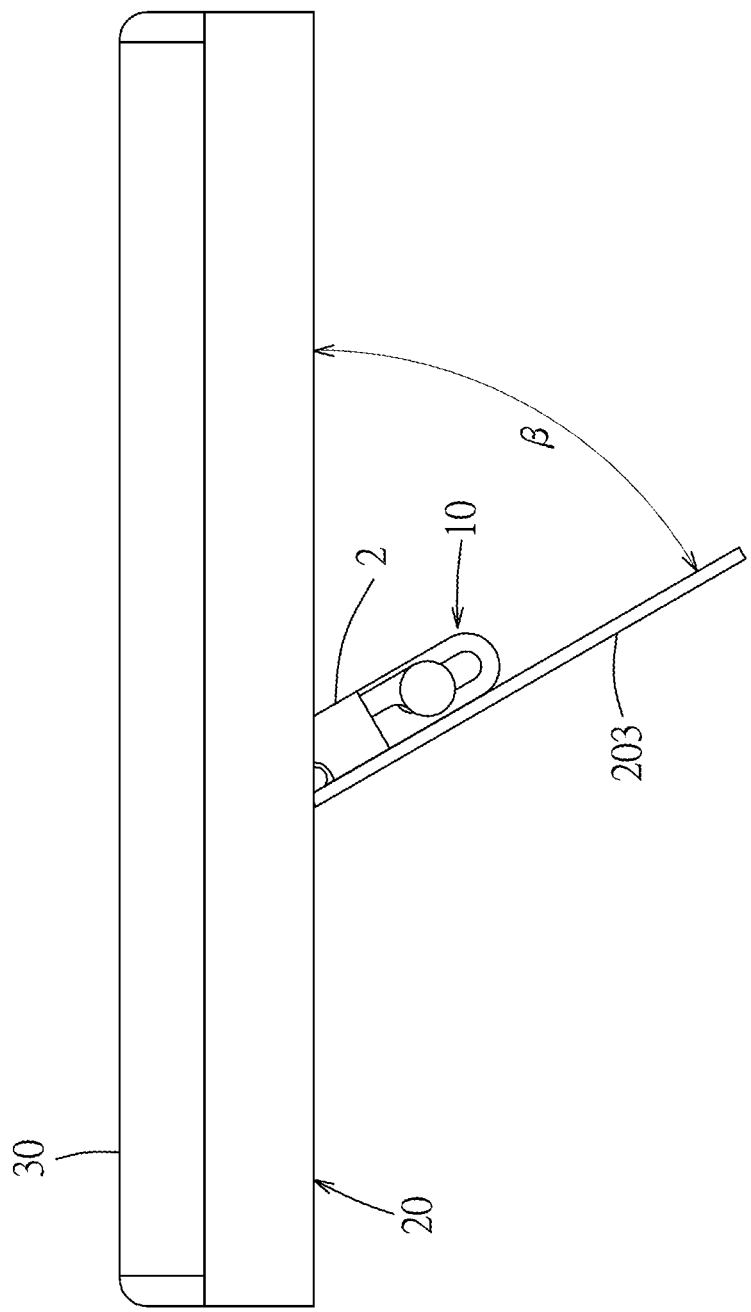
FIG. 8 is the same view as FIG. 6, but illustrating that the support plate is rotated to a second angle.
Figure 9:
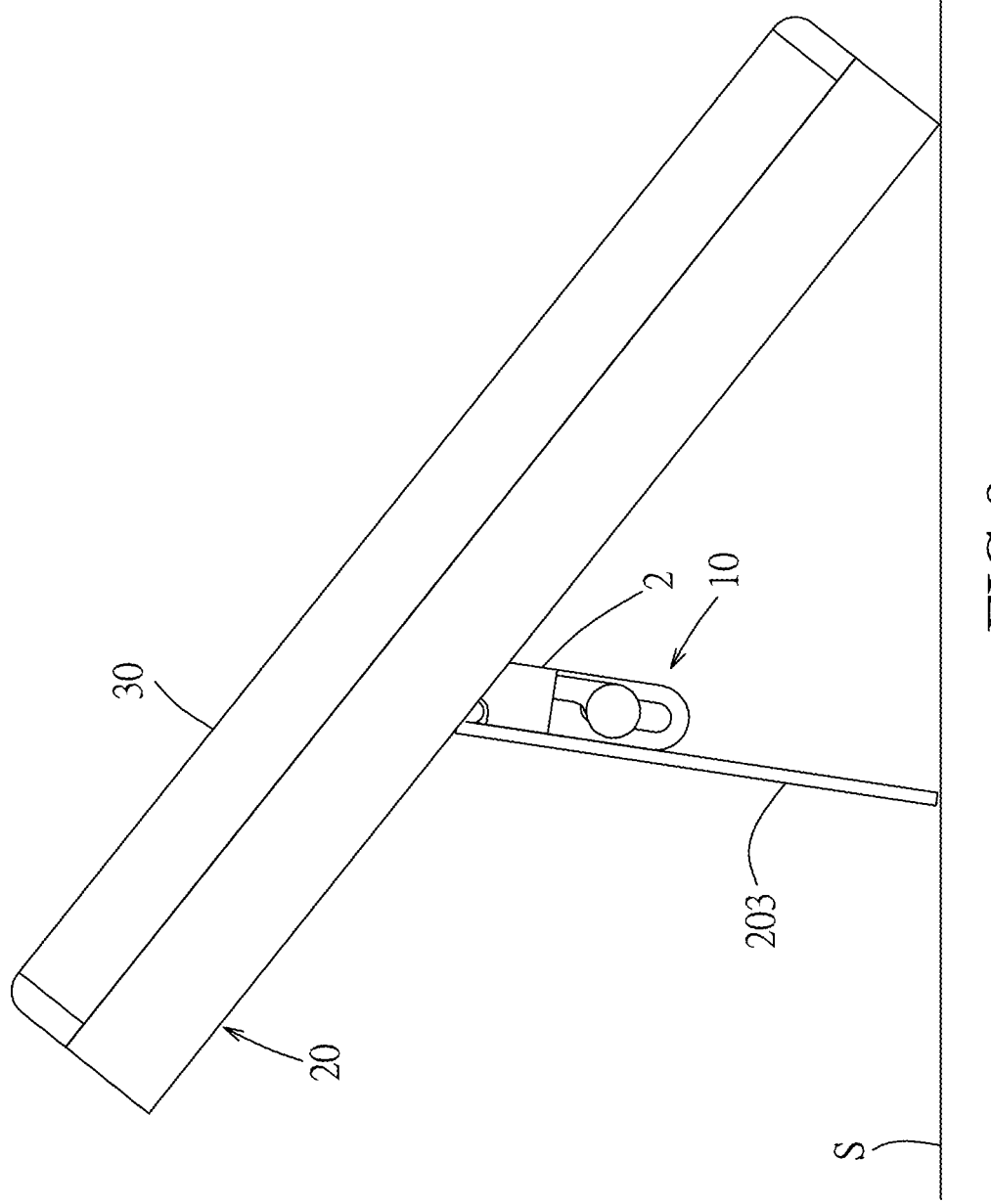
FIG. 9 is a side view illustrating that the support plate of the foldable back support holder rotated to the second angle is placed on a support surface to hold the electronic device at an inclined position.

Referring to FIGS. 8 and 9, when the support plate 203 is unfolded to rotate the second base 2 to a predetermined angle (β) small than the angle (α), an angle between the surface (S) and the electronic device 30 increases, and the electronic device is lifted to a higher level as shown FIG. 9.

To sum up, the multi-link hinge assembly 10 can produce first and second torsional friction forces to stably hold the foldable back support holder 20 at a desired unfolded position on a support surface (S). The foldable back support holder 20 may be miniaturized when assembled with the multi-link hinge assembly 10 according to the disclosure.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A multi-link hinge assembly, comprising:
   a first link lever unit including a first link lever and a first sliding rod, said first link lever having a first fixed end and a first sliding end opposite to said first fixed end, said first sliding rod extending through said first sliding end;
   a second link lever unit including a second link lever and a second sliding rod, said second link lever having a second fixed end and a second sliding end opposite to said second fixed end, said second fixed end overlapping said first fixed end, said second sliding rod being parallel to said first sliding rod and extending through said second sliding end;
   a central shaft extending through said first and second link levers, between said first fixed end and said first sliding end, and between said second fixed end and said second sliding end;
   a first base having a first inner end proximate to said central shaft, a first outer end distal from said central shaft, and two opposite first sliding grooves each extending from said first inner end to said first outer end, said first sliding end being slidably disposed in said first base, said second fixed end extending into and pivotally connected to said first inner end of said first base, said first sliding rod having two opposite ends respectively and slidably disposed in said first sliding grooves;
   a second base juxtaposed with said first base, and having a second inner end proximate to said central shaft, a second outer end distal from said central shaft, and two opposite second sliding grooves each extending from said second inner end to said second outer end, said second sliding end being slidably disposed in said second base, said first fixed end extending into and pivotally connected to said second inner end of said second base, said second sliding rod having two opposite ends respectively and slidably disposed in said second sliding grooves;
   a first torque shaft parallel to said central shaft and extending through said first base and said second fixed end, said first torque shaft being connected to said first base in interference fit; and
   a second torque shaft parallel to said central shaft and extending through said second base and said first fixed end, said second torque shaft being connected to said second base in interference fit;
   wherein, when said second base is rotated relative to said first torque shaft, said first sliding rod moves along said first sliding grooves toward said central shaft, and said second sliding rod moves along said second sliding grooves toward said central shaft.

2. The multi-link hinge assembly as claimed in claim 1, wherein:
   said first link lever unit further includes a third link lever;
   said second link lever unit further includes a fourth link lever;
   said multi-link hinge assembly further includes two torque units;
   said first base further has a first extension plate extending from said first outer end oppositely of said central shaft and having a first elongated opening;

said second base further has a second extension plate extending from said second outer end oppositely of said central shaft and having a second elongated opening;

said first sliding rod extends through one end of said third link lever;

said second sliding rod extends through one end of said fourth link lever; and one of said torque units extends through another end of said third link lever and said first elongated opening, and is slidable along said first elongated opening, the other one of said torque units extending through another end of said fourth link lever and said second elongated opening, and being slidable along said second elongated opening.

3. The multi-link hinge assembly as claimed in claim 2, wherein each of said torque units includes a spindle, a friction plate, a plurality of resilient plates and a fastener, said spindle being inserted into said one end of one of said third and fourth link levers, and being slidable along and extending through one of said first elongated opening and said second elongated opening, said friction plate being sleeved on said spindle and abutting against one of said third and fourth link levers, said resilient plates being sleeved on said spindle to resiliently push said friction plate against one of said third and fourth link levers, said fastener being attached to said spindle to tightly hold said friction plate and said resilient plates against one of said third and fourth link levers.

4. The multi-link hinge assembly as claimed in claim 2, wherein:

said first base further has a first bottom wall and two opposite first side walls connected to said first bottom wall, each of said first bottom wall and said first side walls extending from said first inner end to said first outer end, said first extension plate being connected to said first bottom wall at said first outer end, said first sliding grooves being respectively disposed in said first side walls; and said second base further has a second bottom wall and two opposite second side walls connected to said second bottom wall, each of said second bottom wall and said second side walls extending from said second inner end to said second outer end, said second extension plate being connected to said second bottom wall at said second outer end, said second sliding grooves being respectively disposed in said second side walls.

5. The multi-link hinge assembly as claimed in claim 1, wherein:

said first link lever has a plurality of first lever plates juxtaposed with each other; and said second link lever has a plurality of second lever plates juxtaposed with each other.

* * * * *